(12) United States Patent
Nagai

(10) Patent No.: US 10,608,000 B1
(45) Date of Patent: Mar. 31, 2020

(54) SEMICONDUCTOR DEVICE

(71) Applicant: UNITED MICROELECTRONICS CORP., Hsin-Chu (TW)

(72) Inventor: Yukihiro Nagai, Saijo (JP)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/191,413

(22) Filed: Nov. 14, 2018

(30) Foreign Application Priority Data

Oct. 9, 2018 (CN) .......................... 2018 1 1172248

(51) Int. Cl.
| | |
|---|---|
| *H01L 29/06* | (2006.01) |
| *H01L 27/112* | (2006.01) |
| *H01L 23/525* | (2006.01) |

(52) U.S. Cl.
CPC .... *H01L 27/11206* (2013.01); *H01L 23/5256* (2013.01); *H01L 29/0649* (2013.01)

(58) Field of Classification Search
CPC . H01L 29/0642; H01L 29/0649; H01L 29/14; H01L 29/42356; H01L 21/76232; H01L 21/76229; H01L 21/28587; H01L 21/28593; H01L 21/28114; H01L 2029/42388; H01L 27/11206; H01L 23/5256

See application file for complete search history.

(56) References Cited

U.S. PATENT DOCUMENTS

| | | | |
|---|---|---|---|
| 6,498,062 B2 | 12/2002 | Durcan et al. | |
| 7,518,184 B2 | 4/2009 | Tran | |
| 8,716,828 B2 * | 5/2014 | Carter | ............... H01L 21/76232 257/510 |
| 8,748,978 B2 | 6/2014 | Lee | |
| 9,659,943 B1 * | 5/2017 | Tran | .................. H01L 27/11206 |

* cited by examiner

*Primary Examiner* — Hsien Ming Lee
(74) *Attorney, Agent, or Firm* — Winston Hsu

(57) ABSTRACT

A semiconductor device includes a shallow trench isolation (STI) in a substrate and a first gate structure on the STI. Preferably, the first gate structure comprises a first horizontal portion on the STI, a vertical portion connected to the first horizontal portion and extended into part of the STI, and a second horizontal portion connected to the vertical portion. The semiconductor device further includes a first spacer on a sidewall of the first gate structure and the STI and a second spacer on another sidewall of the first gate structure and on the second horizontal portion.

17 Claims, 3 Drawing Sheets

SEMICONDUCTOR DEVICE

BACKGROUND OF THE INVENTION

1. Field of the Invention

The invention relates to a method for fabricating semiconductor device, and more particularly, to a method of fabricating fuse structure of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a semiconductor device includes a shallow trench isolation (STI) in a substrate and a first gate structure on the STI. Preferably, the first gate structure comprises a first horizontal portion on the STI, a vertical portion connected to the first horizontal portion and extended into part of the STI, and a second horizontal portion connected to the vertical portion. The semiconductor device further includes a first spacer on a sidewall of the first gate structure and the STI and a second spacer on another sidewall of the first gate structure and on the second horizontal portion.

According to another aspect of the present invention, a semiconductor device includes a shallow trench isolation (STI) in a substrate and a first gate structure on the STI and extended into part of the STI and part of the substrate, wherein the first gate structure comprises a T-shape. Preferably, first gate structure further includes a horizontal portion on the STI and part of the substrate and a vertical portion extended into part of the STI and part of the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
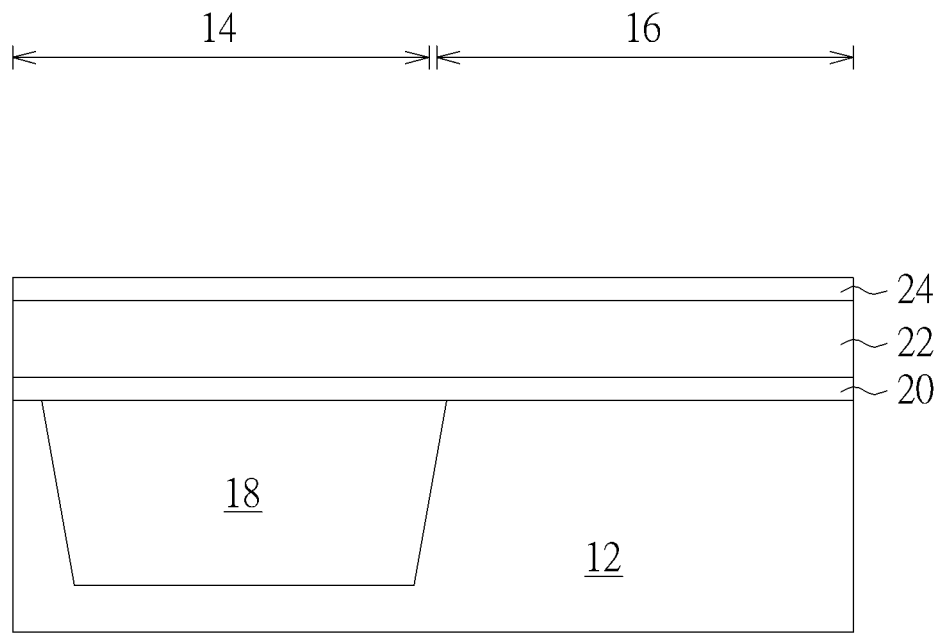
FIGS. 1-4 illustrate a method for fabricating semiconductor device according to an embodiment of the present invention.

Referring to FIGS. 1-4, FIGS. 1-4 illustrate a method for fabricating semiconductor device according to an embodiment of the present invention. As shown in FIG. 1, a substrate 12 such as a silicon substrate or silicon-on-insulator (SOI) substrate is provided and a memory region 14 and an active region 16 are defined on the substrate 12. Preferably, a shallow trench isolation (STI) 18 made of silicon oxide is formed in the substrate 12 on the memory region 14 and a well region such as n-well or p-well could be formed in the substrate 12 on the active region 16.

Next, at least a gate structure is formed on the substrate 12. For instance, it would be desirable to sequentially form a gate dielectric layer 20, a gate material layer 22, and a hard mask 22 on the substrate 12 on both memory region 14 and active region 16, in which the gate dielectric layer 20 is preferably made of silicon oxide, the gate material layer 22 is made of doped polysilicon, and the hard mask 24 is made of silicon oxide or silicon nitride.

Figure 2:
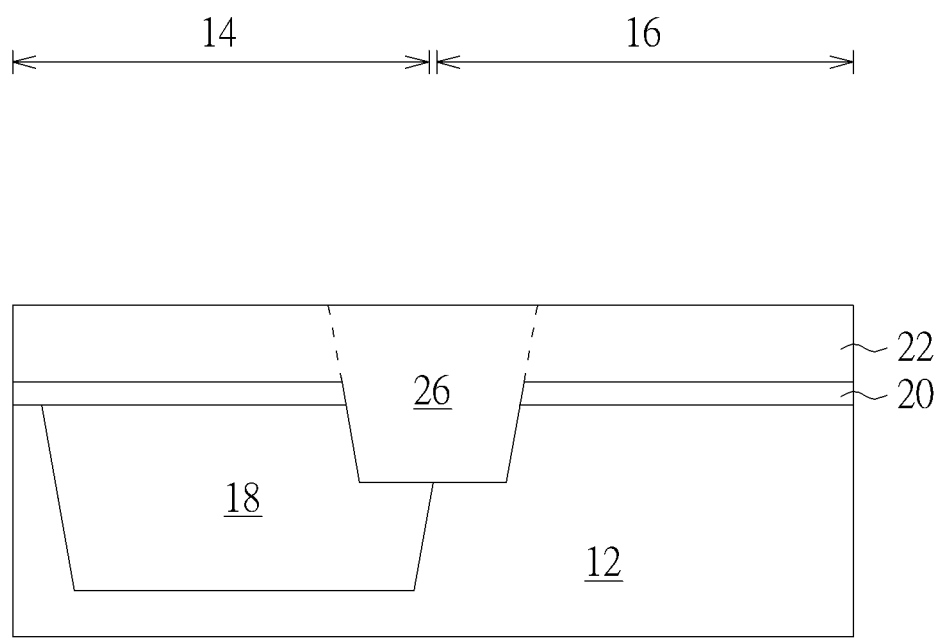

Next, as shown in FIG. 2, it would then be desirable to conduct a bit line fabrication process on the memory region 14 by using a photo-etching process to remove part of the hard mask 24, part of the gate material layer 22, part of the gate dielectric layer 20, part of the STI 18, and part of the substrate 12 between the memory region 14 and active region 16 to form a trench (not shown). Next, a material layer 26 preferably made of silicon is formed on the hard mask 24 to fill the trench completely, and a planarizing process such as chemical mechanical polishing (CMP) and/or etching process is conducted to remove all of the hard mask 24 and part of the material layer 26 to expose the top surface of the gate material layer 22 so that the top surface of the remaining material layer 26 is even with top surface of the gate material layer 22.

According to an embodiment of the present invention, if the material layer 26 and the gate material layer 22 were made of same material such as polysilicon, the material layer 26 embedded within the trench and the gate material layer 22 are preferably united into one unit after the planarizing process. Nevertheless, according to another embodiment of the present invention, the material layer 26 and the gate material layer 22 could also be made of different materials, such as the material layer 26 could include amorphous silicon while the gate material layer 22 include polysilicon, which is also within the scope of the present invention.

Figure 3:
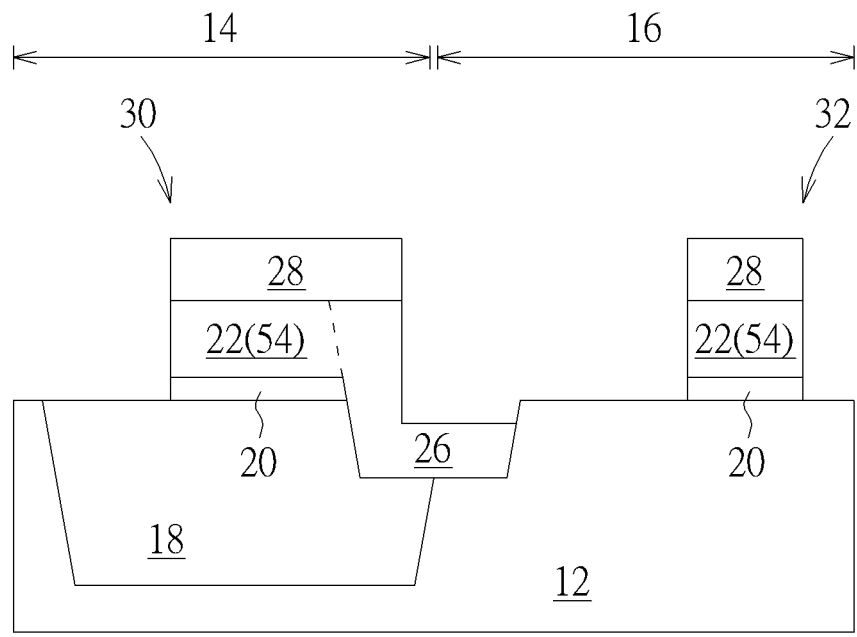

Next, as shown in FIG. 3, another hard mask 28 is formed to cover the surface of the gate material layer 22 on both memory region 14 and active region 16, and a photo-etching process is conducted to remove part of the hard mask 28, part of the gate material layer 22, and part of the material layer 26 to form a first gate structure 30 on the memory region 14 and a second gate structure 32 on the active region 16 at the same time. It should be noted that when an etching process is conducted to remove part of the gate material layer 22 to form the first gate structure 30 and second gate structure 32 at this stage, it would be desirable to over-etch part of the material layer 26 between the memory region 14 and active region 16 (or more specifically the intersecting point of the memory region 14 and active region 16) so that a top surface between the memory region 14 and active region 16 is slightly lower than the top surface of the STI 18 and substrate 12.

Figure 4:
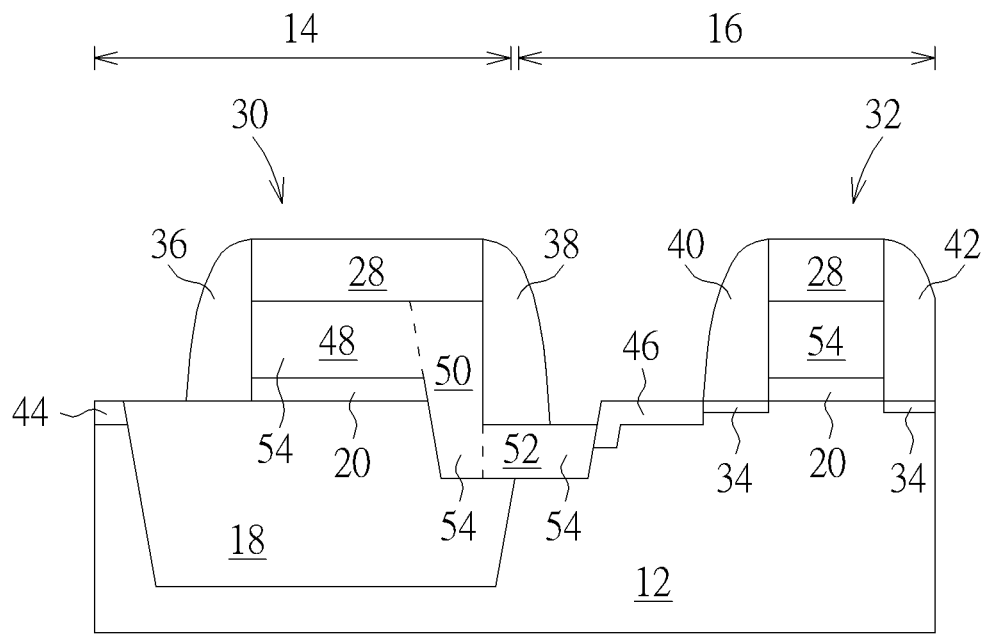

Next, as shown in FIG. 4, an ion implantation process is conducted to form doped regions 34 or lightly doped drains (LDDs) in the substrate 12 adjacent to two sides of the second gate structure 32, and then a spacer is formed on the sidewalls of each of the first gate structure 30 and second gate structure 32, including a spacer 36 and spacer 38 on sidewalls of the first gate structure 30 and spacer 40 and spacer 42 on sidewalls of the second gate structure 32. Next, another ion implantation process is conducted to form doped regions 44, 46 or source/drain regions in the substrate 12 adjacent to two sides of the spacers 36, 38.

In this embodiment, each of the spacers 36, 38, 40, 42 could be a single spacer or a composite spacer including an offset spacer and a main spacer, in which the offset spacer and the main spacer could be made of same material or different materials while both types of spacers could be selected from the group consisting of silicon oxide ($SiO_2$), silicon nitride (SiN), silicon oxynitride (SiON), and silicon carbon nitride (SiCN). Each of the doped regions 34, 44, 46 could include dopants and/or epitaxial materials having different conductive types depending on the type of transistor being fabricated. For instance, the doped regions 34, 44, 46 formed on the memory region 14 and active region 16 in this embodiment preferably includes n-type dopants and the concentration of the doped region 34 is preferably less than the concentration of doped regions 44, 46. This completes the fabrication of a semiconductor device according to an embodiment of the present invention.

Referring again to FIG. 4, which further illustrates a structural view of a semiconductor device according to an embodiment of the present invention. As shown in FIG. 4, the semiconductor device includes a STI 18 disposed in the substrate 12, a first gate structure 30 disposed on the STI 18, a second gate structure 32 disposed on the substrate 12 adjacent to the first gate structure 30, a hard masks 28 disposed on each of the first gate structure 30 and second gate structure 32, a spacer 36 disposed on a sidewall of the first gate structure 30 and on the STI 18, a spacer 38 disposed on another sidewall of the first gate structure 30, a spacer 40 disposed on a sidewall of the second gate structure 32, and a spacer 42 disposed on another sidewall of the second gate structure 32. The top surface of each of the spacers 36, 38, 40, 42 is preferably even with the top surface of the hard masks 28.

Viewing from a more detailed perspective, the first gate structure 30 or gate electrode 54 further includes a first horizontal portion 48 disposed on the STI 18, a vertical portion 50 connected to the first horizontal portion 48 and extended into part of the STI 18, and a second horizontal portion 52 connected to the vertical portion 50, in which the vertical portion 50 directly contacts the spacer 38, the first horizontal portion 48, vertical portion 50, and second horizontal portion 52 are preferably made of same material such as polysilicon, and all three portions 48, 50, 52 are monolithically formed or formed in unity. It should be noted that the spacer 38 disposed on a sidewall of the first gate structure 30 is also disposed directly on top of the second horizontal portion 52 while the bottom or more specifically the bottommost surface of the spacer 38 is lower than the bottom (or bottommost) surface of the spacer 36.

The semiconductor device also includes a doped region 44 disposed on one side of the STI 18, a doped region 46 disposed on another side of the STI 18 and directly contacting the second horizontal portion 52, a doped region 34 disposed on one side of the second gate structure 32 and directly under the spacer 40, and another doped region 34 disposed on another side of the second gate structure 32 and directly under the spacer 42. Preferably, the doped region 46 is disposed between the second horizontal portion 52 and the spacer 40 and directly contacting the second horizontal portion 52 and the doped region 34 and the concentration of the doped regions 34 is preferably lower than the concentration of doped regions 44, 46.

Figure 5:
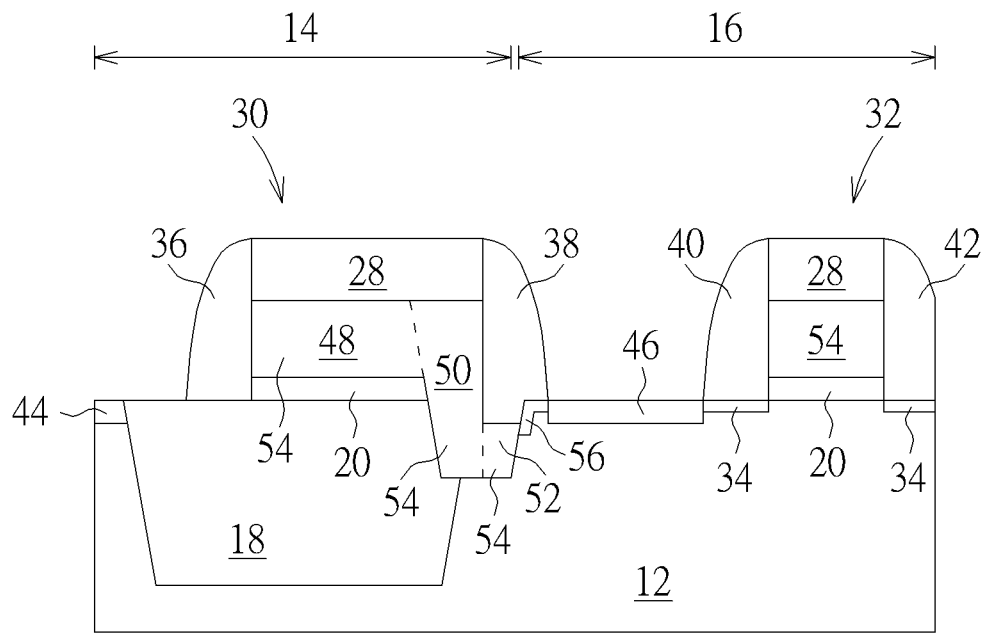
FIG. 5 illustrates a structural view of a semiconductor device according to an embodiment of the present invention.

Referring to FIG. 5, FIG. 5 illustrates a structural view of a semiconductor device according to an embodiment of the present invention. As shown in FIG. 5, the semiconductor device preferably includes a STI 18 disposed in the substrate 12, a first gate structure 30 disposed on the STI 18, a second gate structure 32 disposed on the substrate 12 adjacent to the first gate structure 30, a hard masks 28 disposed on each of the first gate structure 30 and second gate structure 32, a spacer 36 disposed on a sidewall of the first gate structure 30 and on the STI 18, a spacer 38 disposed on another sidewall of the first gate structure 30, a spacer 40 disposed on a sidewall of the second gate structure 32, and a spacer 42 disposed on another sidewall of the second gate structure 32. The top surface of each of the spacers 36, 38, 40, 42 is preferably even with the top surface of the hard masks 28.

Similar to the aforementioned embodiments, the first gate structure 30 or gate electrode 54 further includes a first horizontal portion 48 disposed on the STI 18, a vertical portion 50 connected to the first horizontal portion 48 and extended into part of the STI 18, and a second horizontal portion 52 connected to the vertical portion 50, in which the vertical portion 50 directly contacts the spacer 38, the first horizontal portion 48, vertical portion 50, and second horizontal portion 52 are preferably made of same material such as polysilicon, and all three portions 48, 50, 52 are monolithically formed or formed in unity. In contrast to the spacer 38 from the previous embodiment is completely disposed on top of the second horizontal portion 52, the spacer 38 adjacent to the vertical portion 50 in this embodiment is not only disposed on top of the second horizontal portion 52 but also extended to the right and standing on part of the substrate 12. Moreover, an additional doped region 56 is disposed in the substrate 12 directly under the spacer 38, in which the doped region 56 is connected and directly contacting the doped region 46 on the right and the second horizontal portion 52 on the left, and the concentration of doped region 56 is preferably equal to the concentration of doped region 34 but lower than the concentration of doped regions 44, 46.

Figure 6:
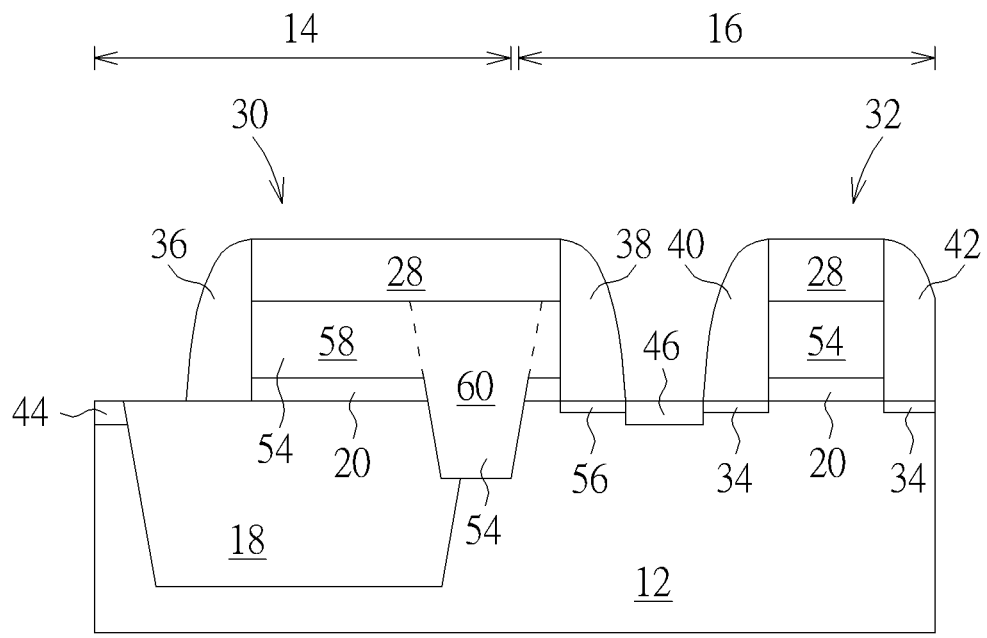
FIG. 6 illustrates a structural view of a semiconductor device according to an embodiment of the present invention.

Referring to FIG. 6, FIG. 6 illustrates a structural view of a semiconductor device according to an embodiment of the present invention. As shown in FIG. 6, the semiconductor device preferably includes a STI 18 disposed in the substrate 12, a first gate structure 30 disposed on the STI 18, a second gate structure 32 disposed on the substrate 12 adjacent to the first gate structure 30, a hard masks 28 disposed on each of the first gate structure 30 and second gate structure 32, a spacer 36 disposed on a sidewall of the first gate structure 30 and on the STI 18, a spacer 38 disposed on another sidewall of the first gate structure 30, a spacer 40 disposed on a sidewall of the second gate structure 32, and a spacer 42 disposed on another sidewall of the second gate structure 32. The top surface of each of the spacers 36, 38, 40, 42 is preferably even with the top surface of the hard masks 28.

In contrast to the first gate structure 30 from the aforementioned embodiments including two horizontal portions and a vertical portion, the first gate structure 30 in this embodiment is disposed on the STI 18 and extended downward into part of the STI 18 and part of the substrate 12 as the first gate structure 30 or gate electrode 54 includes a T-shape cross-section. Viewing from a more detailed perspective, the first gate structure 30 or gate electrode 54 includes a horizontal portion 58 disposed on the STI 18 and part of the substrate 12 and a vertical portion 60 extended into and directly contacting part of the STI 18 and part of the substrate 12. Similar to the aforementioned embodiments, the horizontal portion 58 and vertical portion 60 of the first gate structure 30 are preferably made of same material layer such as polysilicon as the two portions 58, 60 are monolithically formed or formed in unity. Moreover, a doped region 56 is disposed in the substrate 12 directly under the spacer 38, in which edges of the doped region 56 could be aligned with inner and outer sidewalls of the spacer 38, the doped region 56 is connected and directly contacting the doped region 46 on the right, and the concentration of the doped region 56 is equal to the concentration of doped region 34 but lower than the concentration of doped regions 44, 46. It should be noted that even though the doped region 56 does not contact the vertical portion 60 directly in this embodiment, according to other embodiment of the present invention, the doped region 56 could also be extended to the left to directly contact the vertical portion 60 so that signals could be transmitted from the gate electrode 54 of the first gate structure 30 to the second gate structure 32 through the substrate 12.

Overall, in contrast to connecting the transistor on memory region to transistors on active region through higher level metal interconnections, the present invention preferably connects the transistors on memory region to transistors on active region through doped regions within the substrate without forming any contact plug or metal interconnection on the doped region between the transistor on the memory region and the transistor on the active region. For instance, no contact plug is formed to directly contact the doped region 46 in the aforementioned embodiments so that the doped region 46 preferably remains floating. Specifically, the doped region 46 shown in FIG. 4 and the doped regions 46, 56 shown in FIGS. 5-6 are preferably used as bridges for signal transmission between transistor on the memory region 14 and transistor on the active region 16. By using this design it would be desirable to relax the pitch of metal interconnections in the entire area as bit line voltages are applied in the memory region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a shallow trench isolation (STI) in a substrate;
   a first gate structure on the STI, wherein the first gate structure comprises:
      a first horizontal portion on the STI;
      a vertical portion connected to the first horizontal portion and extended into part of the STI; and
      a second horizontal portion connected to the vertical portion, wherein a top surface of the second horizontal portion is lower than a top surface of the first horizontal portion.

2. The semiconductor device of claim 1, further comprising:
   a first spacer on one sidewall of the first gate structure and on the STI; and
   a second spacer on another sidewall of the first gate structure and on the second horizontal portion.

3. The semiconductor device of claim 2, wherein a bottom surface of the second spacer is lower than a bottom surface of the first spacer.

4. The semiconductor device of claim 2, further comprising a hard mask on the first gate structure, wherein top surfaces of the hard mask, the first spacer, and the second spacer are coplanar.

5. The semiconductor device of claim 2, wherein the vertical portion contacts the second spacer directly.

6. The semiconductor device of claim 1, wherein a top surface of the second horizontal portion is lower than a top surface of the STI.

7. The semiconductor device of claim 1, wherein the second horizontal portion is in part of the STI and part of the substrate.

8. The semiconductor device of claim 1, further comprising:
   a first doped region on one side of the STI; and
   a second doped region on another side of the STI and contacting the second horizontal portion.

9. The semiconductor device of claim 8, further comprising:
   a second gate structure on the substrate and adjacent to the first gate structure; and
   a third spacer on one side of the second gate structure, wherein the second doped region is between the second horizontal portion and the third spacer.

10. The semiconductor device of claim 9, further comprising a third doped region under the third spacer, wherein a concentration of the third doped region is lower than a concentration of the second doped region.

11. A semiconductor device, comprising:
    a shallow trench isolation (STI) in a substrate; and
    a first gate structure on the STI and extended into part of the STI and part of the substrate, wherein the first gate structure comprises a T-shape and a bottom surface of the T-shape contacts the STI and the substrate directly.

12. The semiconductor device of claim 11, wherein the first gate structure comprises:
    a horizontal portion on the STI and part of the substrate; and
    a vertical portion extended into part of the STI and part of the substrate.

13. The semiconductor device of claim 12, further comprising:
    a first spacer on one sidewall of the first gate structure and on the STI; and
    a second spacer on another sidewall of the first gate structure and on the substrate.

14. The semiconductor device of claim 13, further comprising a hard mask on the first gate structure, wherein top surfaces of the hard mask, the first spacer, and the second spacer are coplanar.

15. The semiconductor device of claim 13, further comprising:
    a first doped region on one side of the STI; and
    a second doped region on another side of the STI and directly under the second spacer.

16. The semiconductor device of claim 15, further comprising:
    a second gate structure on the substrate and adjacent to the first gate structure; and
    a third spacer on one side of the second gate structure; and
    a third doped region between the second spacer and the third spacer.

17. The semiconductor device of claim 16, further comprising a fourth doped region under the third spacer, wherein a concentration of the fourth doped region is lower than a concentration of the third doped region.

\* \* \* \* \*